United States Patent
Zhao et al.

(10) Patent No.: US 11,774,928 B2
(45) Date of Patent: Oct. 3, 2023

(54) INTERVENTIONAL CONTROL METHOD BASED ON COMPUTER CONTROL SYSTEM AND INTERVENTIONAL COMPUTER CONTROL SYSTEM

(71) Applicant: Puyang Baifu Reide Petroleum Science and Technology Company Limited, Puyang (CN)

(72) Inventors: Gang Zhao, Puyang (CN); Chen Chen, Tianjin (CN); Chun Yu, Puyang (CN); Yulong Xia, Puyang (CN); Yingdong Zhang, Puyang (CN)

(73) Assignee: Puyang Baifu Reide Petroleum Science and Technology Company Limited, Puyang (CN)

( * ) Notice: Subject to any disclaimer, the term of this patent is extended or adjusted under 35 U.S.C. 154(b) by 758 days.

(21) Appl. No.: 16/959,946

(22) PCT Filed: Oct. 26, 2018

(86) PCT No.: PCT/CN2018/112173
§ 371 (c)(1),
(2) Date: Jan. 27, 2021

(87) PCT Pub. No.: WO2019/134426
PCT Pub. Date: Jul. 11, 2019

(65) Prior Publication Data
US 2021/0208549 A1    Jul. 8, 2021

(30) Foreign Application Priority Data
Jan. 5, 2018 (CN) .......................... 201810009824.3

(51) Int. Cl.
*H03M 1/00* (2006.01)
*G05B 15/02* (2006.01)
(Continued)

(52) U.S. Cl.
CPC ............ *G05B 15/02* (2013.01); *H03M 1/001* (2013.01); *H03M 1/12* (2013.01); *H03M 1/72* (2013.01)

(58) Field of Classification Search
CPC . H03M 1/01; H03M 1/22; H03M 1/72; G05B 17/00; G05B 15/02; H05B 19/00
(Continued)

(56) References Cited

U.S. PATENT DOCUMENTS

| | | | | |
|---|---|---|---|---|
| 5,287,088 A | * | 2/1994 | Sills | G10H 1/0008 345/581 |
| 2007/0074174 A1 | * | 3/2007 | Thornton | G06Q 10/06 717/127 |
| 2017/0137141 A1 | * | 5/2017 | Noll | G05D 1/101 |

FOREIGN PATENT DOCUMENTS

| | | |
|---|---|---|
| CN | 101105412 A | 1/2008 |
| CN | 102608927 A | 7/2012 |

(Continued)

OTHER PUBLICATIONS

International Patent Application No. PCT/CN2018/112173; Int'l Written Opinion and Search Report; dated Feb. 2, 2019; 8 pages.

*Primary Examiner* — Peguy Jean Pierre
(74) *Attorney, Agent, or Firm* — BAKERHOSTETLER, LLP (57) ABSTRACT

An interventional control method based on a computer control system. An interventional control system is designed on the basis of an original computer control system; the analog-to-digital conversion unit of the interventional control system receives a signal from the data acquisition module of the original computer control system and said signal is processed by a control processing unit according to a built-in program; then a digital-to-analog conversion unit performs digital-to-analog conversion on the signal output by the control processing unit and then outputs a signal obtained after the digital-to-analog conversion to the analog-to-digital conversion unit of the original computer control system. According to the interventional computer control system, on the basis of an original computer control system, (Continued)

the analog-to-digital conversion unit of the interventional control system receives a signal output from the data acquisition module of the original computer control system and control processing is performed on said output signal; then the digital-to-analog conversion unit of the interventional control system outputs a signal to the analog-to-digital conversion unit of the original computer control system. The function upgrade of an original computer control system is implemented without changing the operating program of the original computer control system.

16 Claims, 4 Drawing Sheets

(51) Int. Cl.
  *H03M 1/12* (2006.01)
  *H03M 1/72* (2006.01)
(58) Field of Classification Search
  USPC .......................................... 341/155, 144, 110
  See application file for complete search history.

(56) References Cited

FOREIGN PATENT DOCUMENTS

| | | | |
|---|---|---|---|
| CN | 102608944 | A | 7/2012 |
| CN | 204925730 | U | 12/2015 |
| CN | 107908184 | A | 4/2018 |
| CN | 207676204 | U | 7/2018 |
| KR | 101762617 | B1 | 7/2017 |

\* cited by examiner

INTERVENTIONAL CONTROL METHOD BASED ON COMPUTER CONTROL SYSTEM AND INTERVENTIONAL COMPUTER CONTROL SYSTEM

CROSS-REFERENCE TO RELATED APPLICATIONS

This application is a 371 National Stage Application of International Patent Application No. PCT/CN2018/112173 filed Oct. 26, 2018, which claims priority to China Patent Application No. 201810009824.3 filed Jan. 5, 2018, the entire contents of which are incorporated by reference herein.

TECHNICAL FIELD

The present invention relates to computer control technology, and more particularly to a method and system for performing interventional control on the basis of an original computer control system.

BACKGROUND

Computer control systems are widely used in production processes, vehicles, robots and people's daily life in various industries. With the progress of science and technology and the continuous emergence of new technologies, firstly it is necessary to upgrade the original computer control system, but in real production life, sometimes due to technique or cost, it is hard to change the control method of the original computer control system, which hinders the upgrading of the control system; and secondly the automatic control systems are widely used, which makes the conversion between manual operation and automatic control more frequent, resulting in the manual/automatic conversion technology having to meet a further requirement regarding gapless conversion. Therefore, the introduction of computer interventional control systems has become an urgent problem to be solved.

SUMMARY

In view of the shortage of the prior art, an interventional computer control system and method is provided, which provides an effective method for upgrading of the original computer control system and gapless conversion of the manual/automatic operation.

The technical solution adopted by the present invention:

An interventional control method based on computer control system comprises designing an interventional control system on the basis of an original computer control system. The interventional control system comprises an analog-to-digital conversion unit, a control processing unit, and a digital-to-analog conversion unit. The analog-to-digital conversion unit of the interventional control system receives a signal from a data acquisition module of the original computer control system and inputs the signal to the control processing unit of the interventional control system for processing according to a built-in interventional control processing program, then the digital-to-analog conversion unit of the interventional control system performs digital-to-analog conversion on the signal output by the control processing unit, and then outputs a signal obtained after the digital-to-analog conversion to the analog-to-digital conversion unit of the original computer control system, thereby, implementing a function upgrade of the original computer control system without changing the operating program of the original computer control system.

The interventional control system comprises a data acquisition module, and the analog-to-digital conversion unit of the interventional control system receives both signals output from the data acquisition module of the interventional control system and from the data acquisition module of the original computer control system, and the control processing unit processes the output signal and then outputs a control signal which is to be converted by the digital-to-analog conversion unit and then input to the analog-to-digital conversion unit of the original computer control system.

The interventional control system comprises an execution unit which performs a corresponding control instruction according to a control signal output from an operating processing program of the control processing unit of the interventional control system.

In the interventional control method based on computer control system, a manual/automatic operation conversion unit is designed in cooperation with the interventional control system. The manual/automatic operation conversion unit transmits a manual operation data signal to the analog-to-digital conversion unit of the interventional control system through a manual operation sensing module. The control processing unit of the interventional control system analyzes and processes the obtained manual operation data signal and determines whether to copy or change the received manual operation data signal. The copied manual operation data signal is transmitted to the original computer control system by the digital-to-analog conversion unit of the interventional control system, and the changed manual operation data signal is transmitted to the original computer system by the digital-to-analog conversion unit of the interventional control system. An original analog signal of the original computer control system is copied or changed by the interventional control system to implement the gapless access conversion control of manual/automatic operation of the original computer control system.

An interventional computer control system designs an interventional control system on the basis of an original computer control system. The interventional control system comprises an analog-to-digital conversion unit, a control processing unit, and a digital-to-analog conversion unit. The analog-to-digital conversion unit of the interventional control system receives a signal output from a data acquisition module of the original computer control system and inputs the signal to the control processing unit of the interventional control system. The digital-to-analog conversion unit of the interventional control system outputs a signal to the analog-to-digital conversion unit of the original computer control system.

The interventional control system comprises a data acquisition module which comprises one, two or more sensors, and the sensors output a signal to the analog-to-digital conversion unit of the interventional control system.

The interventional control system comprises an execution unit, and the control processing unit of the interventional control system has an output connected to the execution unit.

In the interventional computer control system, a manual/automatic operation conversion unit is designed in cooperation with the interventional control system, wherein the manual/automatic operation conversion unit includes a manual operation sensing module which outputs a signal to the analog-to-digital conversion unit of the interventional control system.

The beneficial effects of the invention:

1. The interventional control method based on computer control system and the interventional computer control system of the present invention implement the upgrade of the original computer control system by changing the analog signal of the original computer control system without changing the operation program of the original computer control system, getting rid of the shackles of the original manufacturer and solving the actual production problems.

2. The interventional control method based on computer control system and the interventional computer control system of the present invention expand the range of information acquisition for the original computer control system, improve the safety function of the original computer control system, and greatly reduce the replacement cost compared with the redesign and remake, and facilitate the safe production and upgrading of equipment.

3. The interventional control method based on computer control system and the interventional computer control system of the present invention implement the gapless conversion of the manual/automatic operation of the automatic control system, and completely solve the problem of discontinuous system operation existing in the existing manual/automatic operation conversion process, so that the human and machine behave as a whole, which paves the way for the application of artificial intelligence.

DETAILED DESCRIPTION

The technical solutions of the present invention are further described in detail below through Detailed Description.

Embodiment 1

Figure 1:
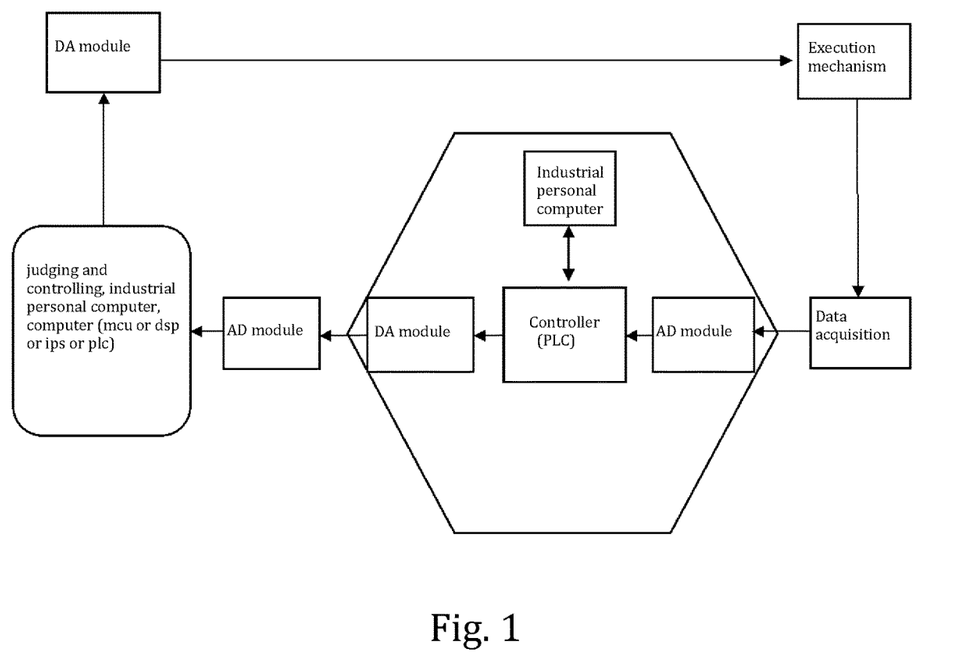
FIG. 1 is a block structural schematic diagram of an interventional computer control system of the present invention (an interventional control system is shown in the diamond block)

Referring to FIG. 1, an interventional control method based on computer control system of the present invention comprises designing an interventional control system on the basis of an original computer control system. The interventional control system comprises an analog-to-digital conversion unit, a control processing unit, and a digital-to-analog conversion unit. The analog-to-digital conversion unit of the interventional control system receives a signal from a data acquisition module of the original computer control system and inputs the signal to the control processing unit of the interventional control system for processing according to a built-in interventional control processing program, then the digital-to-analog conversion unit of the interventional control system performs digital-to-analog conversion on the signal output by the control processing unit, and then outputs a signal obtained after the digital-to-analog conversion to the analog-to-digital conversion unit of the original computer control system, thereby, implementing a function upgrade of the original computer control system without changing the operating program of the original computer control system.

Embodiment 2

Figure 2:
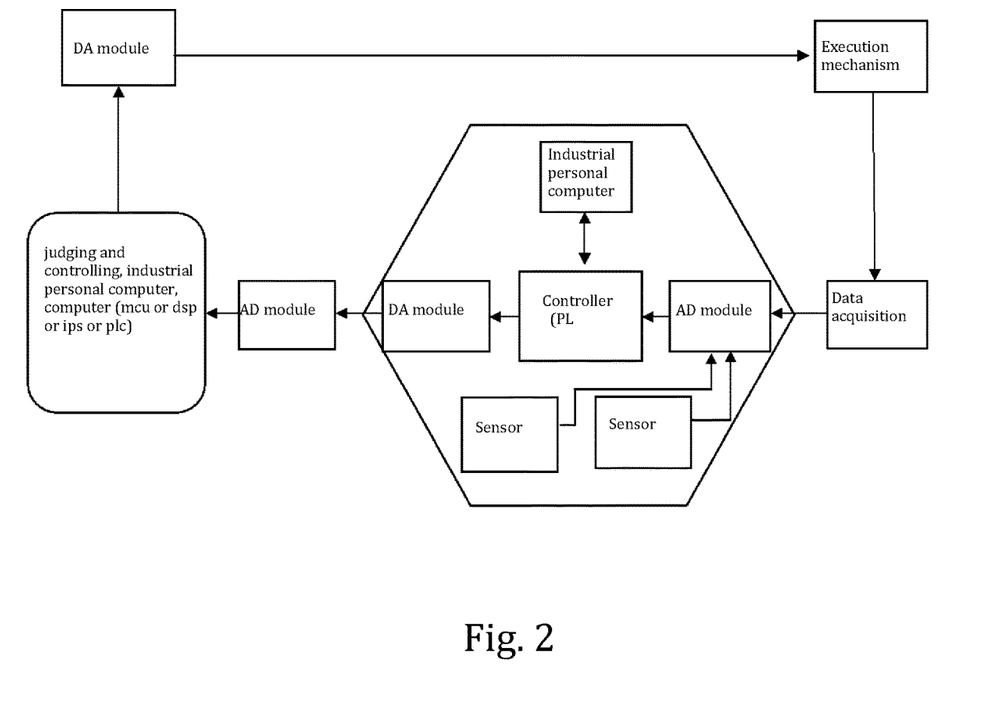
FIG. 2 is a block structural schematic diagram of a composite interventional computer control system (a composite interventional control system is shown in the diamond block)

Referring to FIG. 2, the interventional control method based on computer control system of the present embodiment is different from Embodiment 1 in that: the interventional control system comprises a data acquisition module, and the analog-to-digital conversion unit of the interventional control system receives both signals output from the data acquisition module of the interventional control system and from the data acquisition module of the original computer control system, and the control processing unit processes the output signal and then outputs a control signal which is to be converted by the digital-to-analog conversion unit and then input to the analog-to-digital conversion unit of the original computer control system.

Embodiment 3, Embodiment 4

Figure 3:
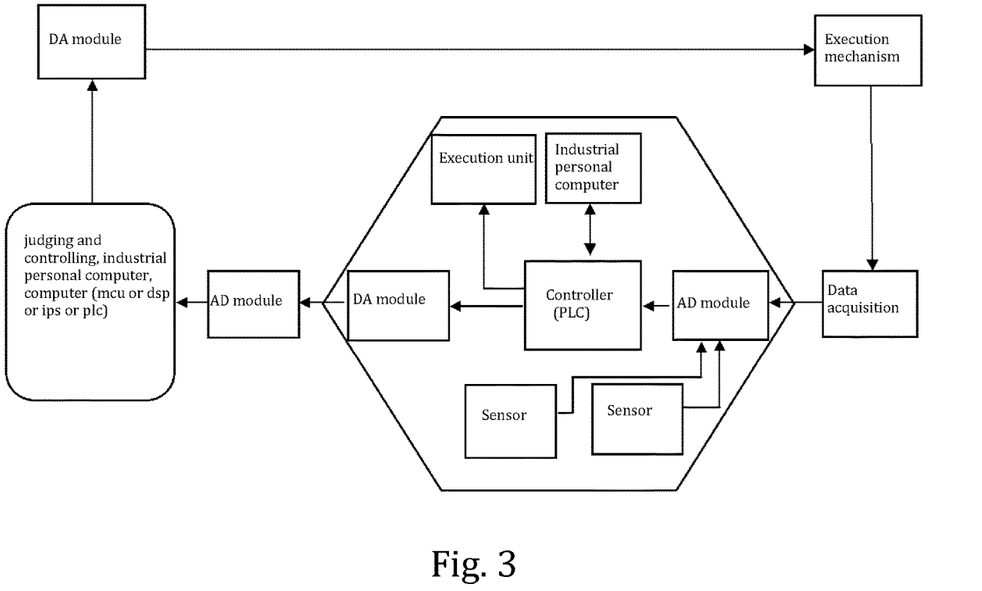
FIG. 3 is a block structural schematic diagram of an extended interventional computer control system (an extended interventional control system is shown in the diamond block)

Referring to FIG. 3, the interventional control method based on computer control system of these two embodiments are different from Embodiment 1 or Embodiment 2 respectively in that: the interventional control system comprises an execution unit which performs a corresponding control instruction according to a control signal output from an operating processing program of the control processing unit of the interventional control system.

Embodiment 5

Figure 4:
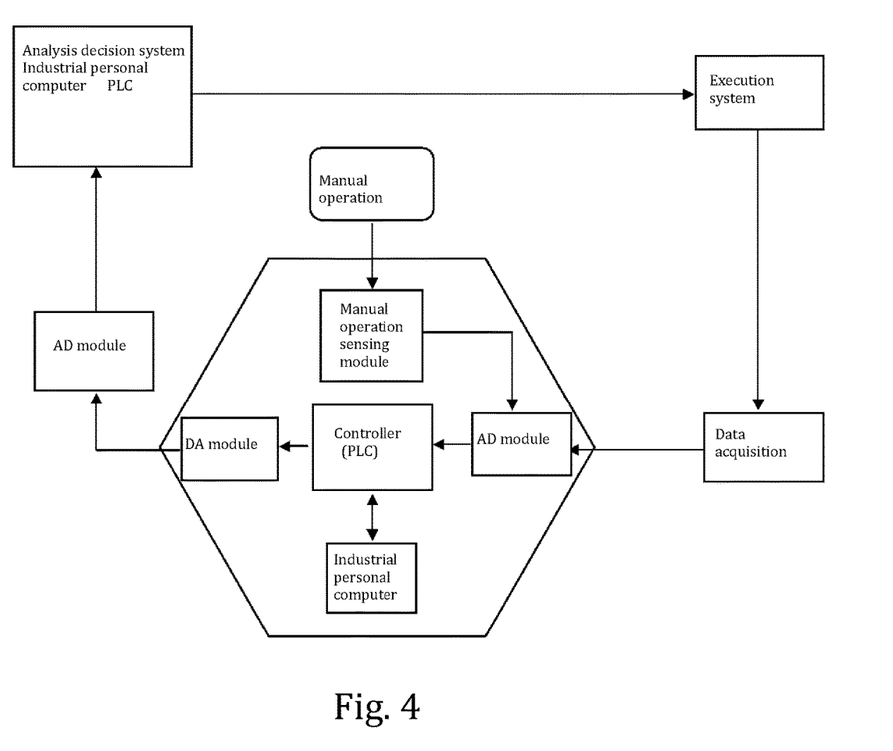
FIG. 4 is a block structural schematic diagram of an interventional computer control system with a manual/automatic operation conversion (an interventional control system with a manual/automatic operation conversion is shown in the diamond block)

Referring to FIG. 4, the interventional control method based on computer control system of the present embodiment is different from the foregoing embodiments in that: a manual/automatic operation conversion unit is designed in cooperation with the interventional control system, wherein the manual/automatic operation conversion unit transmits a manual operation data signal to the analog-to-digital conversion unit of the interventional control system through a manual operation sensing module (including various types of devices and sensors capable of sensing manual operation), and the control processing unit of the interventional control system analyzes and processes the obtained manual operation data signal and determines whether to copy or change the received manual operation data signal, wherein the copied manual operation data signal is transmitted to the original computer control system by the digital-to-analog conversion unit of the interventional control system (the operation result reflects the human operation consciousness), and the changed manual operation data signal is transmitted to the original computer system by the digital-to-analog conversion unit of the interventional control system (the operation result reflects an instruction of the automatic operation program), and wherein an original analog signal of the original computer control system is copied or changed by the interventional control system to implement the gapless access conversion control of manual/automatic operation of the original computer control system.

Embodiment 6

Referring to FIG. 1, an interventional computer control system of the present invention designs an interventional control system on the basis of an original computer control system. The interventional control system comprises an analog-to-digital conversion unit, a control processing unit, and a digital-to-analog conversion unit. The analog-to-digital conversion unit of the interventional control system receives a signal output from a data acquisition module of the original computer control system and inputs the signal to the control processing unit of the interventional control system, and the digital-to-analog conversion unit of the interventional control system outputs a signal to the analog-to-digital conversion unit of the original computer control system.

The interventional control system processes the acquired data signal according to a built-in interventional control processing program to convert it to a analog signal, and then outputs the analog signal to an analog-to-digital conversion unit of the original computer control system, thereby, implementing a function upgrade of the original computer control system without changing the operating program of the original computer control system.

Embodiment 7

Referring to FIG. 2, the interventional computer control system of the present embodiment is different from Embodiment 6 in that: the interventional control system comprises a data acquisition module which comprises one, two or more sensors, and the sensors output a signal to the analog-to-digital conversion unit of the interventional control system.

This embodiment is a composite interventional computer control system. The analog-to-digital conversion unit of the composite interventional computer control system is connected to both the new data acquisition unit and the data acquisition unit of the original computer control system, implanting the composite interventional computer control system into the original computer control system without changing the operation program of the original computer control system (the composite interventional computer control system is connected in series between the data acquisition unit and the digital-to-analog conversion unit of the original computer control system).

Embodiments 8-9

Referring to FIG. 3, the interventional computer control system of these two embodiments are different from Embodiment 6 or Embodiment 7 respectively in that: the interventional control system comprises an execution unit, and the control processing unit of the interventional control system has an output connected to the execution unit.

The two embodiments are extended interventional computer control systems. Implanting the extended interventional control system into the data acquisition unit of the original computer control system increases the range of information acquisition and range of system control of the original computer control system, and copying or changing the original analog signal of the existing computer control system implement the purpose of expanding the function of the original computer control system.

Embodiment 10

Referring to FIG. 4, the interventional computer control system of the present embodiment is different from the foregoing embodiments in that: a manual/automatic operation conversion unit is designed in cooperation with the interventional control system, wherein the manual/automatic operation conversion unit includes a manual operation sensing module which outputs a signal to the analog-to-digital conversion unit of the interventional control system.

The manual operation sensing module (including various types of devices and sensors capable of sensing manual operation) is connected to the analog-to-digital conversion unit of the interventional control system. Without changing the operation program of the original computer control system, the manual operation sensing module is implanted into the analog-to-digital conversion unit of the original computer control system by copying or changing the original analog signal of the original computer control system through the interventional control system, to implement the manual/automatic operation of the original computer control system with gapless conversion interventional control function.

The interventional computer control system of the present invention designs an interventional control system on the basis of an original computer control system (including a data acquisition unit, an analog-to-digital conversion unit, a control processing unit, a digital-to-analog conversion unit, and an execution unit). The interventional control system is implanted between the data acquisition module and the analog-to-digital conversion unit of the original computer control system. After the various types of sensors to which the acquisition unit of the original computer control system belongs acquire the field data in real time, the data is input to the analog-to-digital conversion unit of the interventional computer control system. The control processing unit of the interventional computer control system analyzes and judges the received digital signal according to the setting program, then copies or changes the received digital signal, and then converts the copied or changed digital signal into an analog signal by the digital-to-analog conversion unit of the interventional computer control system for transmitting to the acquisition unit of the original computer control system, thus the function upgrade of the original computer control system is implemented without changing the operation program of the original computer control system. The control processing units of the original computer control system and the interventional control system include computer controllers and industrial personal computers, and the computer controller is connected to the industrial personal computer through a serial port.

Embodiment 11

Figure 5:
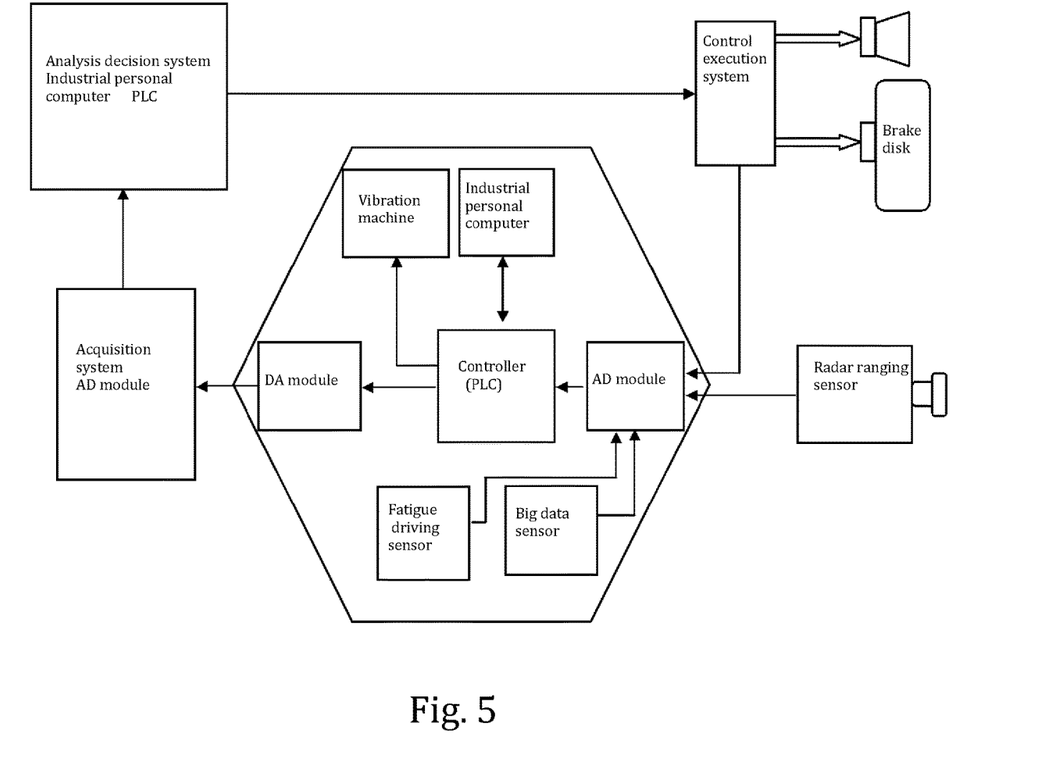
FIG. 5 is a block structural schematic diagram of an automatic braking system of automobile after applying an extended interventional computer control system.

Referring to FIG. 5, this embodiment is an automatic braking system of automobile with an extended interventional computer control system. The extended interventional computer control system is implanted into a data acquisition unit of an original automatic braking system of automobile, increasing the range of information acquisition of the original automatic braking system of automobile (fatigue driving sensor and driver's habit big data sensor), and expanding the range of execution control of the original automatic braking system of automobile (mechanical vibration device). The original analog signal of the original automobile automatic braking system is copied or changed, to implement the purpose of expanding the function of the original automatic braking system of automobile.

Embodiment 12

Figure 6:
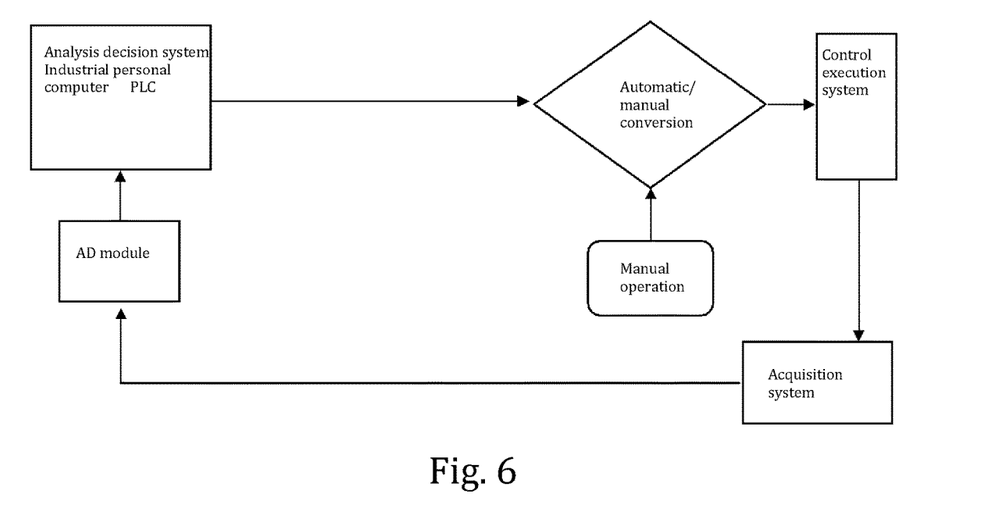
FIG. 6 is a block structural schematic diagram of a manual/automatic operation conversion of an original computer control system.
Figure 7:
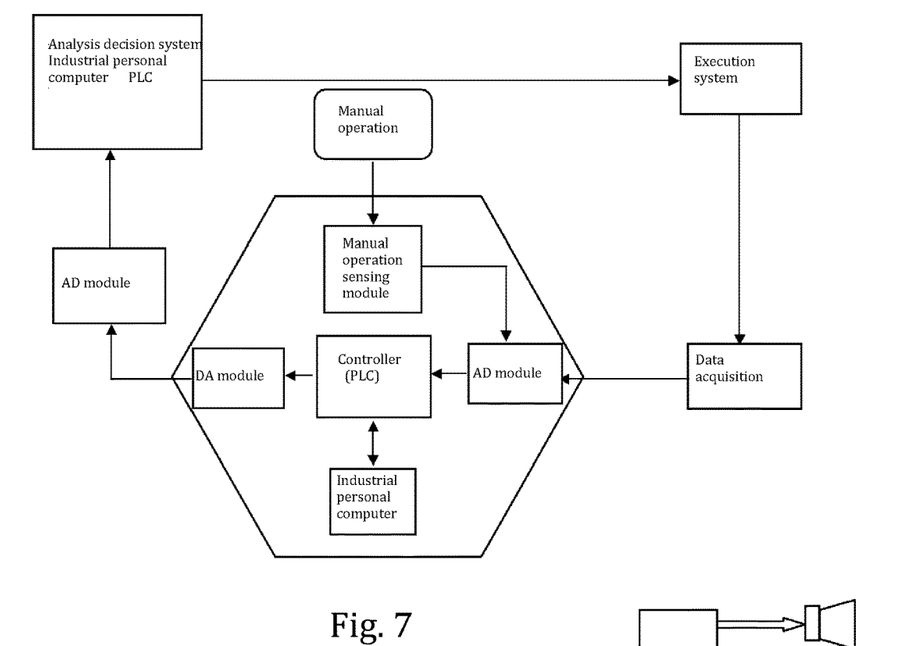
FIG. 7 is a block structural schematic diagram of an manual/automatic operation conversion implemented by applying an interventional computer control system.
Figure 8:
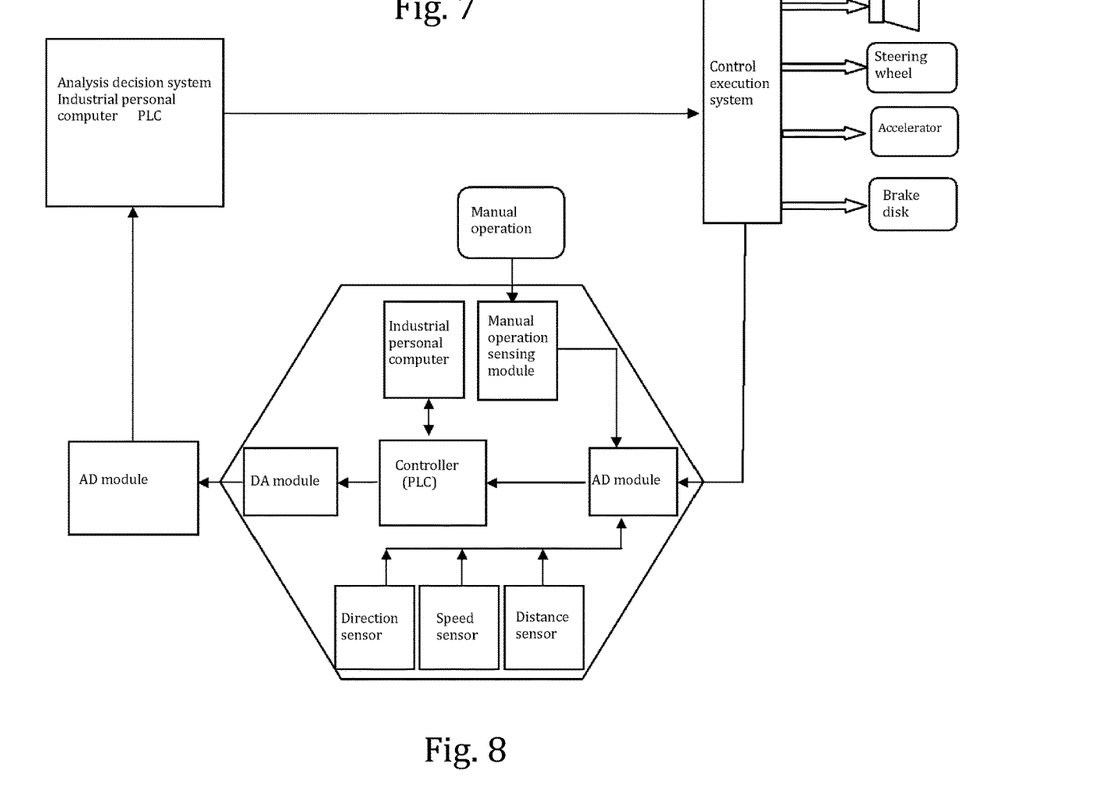
FIG. 8 is a block structural schematic diagram of a manual/automatic safe driving control system conversion after applying an interventional computer control system.

Referring to FIG. 6, FIG. 7, and FIG. 8, the present implementation is an application of the interventional control system/method of the present invention in a manual/automatic safe driving control system. The manual/automatic safe driving control system transmits the manual driving data signal to the analog-to-digital conversion unit of the interventional control system through a manual driving sensing module (including a direction sensor, a distance sensor, a speed sensor and a mechanical transmission device). The control processing unit of the interventional control system analyzes and processes the obtained manual driving data signal, and determines whether to copy or change the received manual driving data signal. The copied manual driving data signal is transmitted to the original safe driving control system by the digital-to-analog conversion unit of the interventional control system (operation results reflect human control of vehicle travel), and the changed manual driving data signal is transmitted to the original safe driving control system by the digital-to-analog conversion unit of the interventional control system (the operation result reflects an instruction of the automatic driving program). An original analog signal of the original safe driving control system is copied or changed by the interventional control system, to implement the gapless access conversion control of manual/automatic operation of the original safe driving control system.

Comparing the manual/automatic safe driving control system designed with interventional control system with the original manual/automatic safe driving control system, the former can make the person who learns driving continuously drive the vehicle, and even if the person who learns driving performs an erroneous operation, the manual/automatic safe driving control system of the interventional control system can still ensure the safety and the fluency of driving; while the original manual/automatic safe driving control system must cut off the connection between the person who learns driving and the vehicle to ensure safety when the person who learns driving performs an erroneous operation, resulting in a break in learning to drive.

The invention claimed is:

1. An interventional control method based on computer control system, the control method comprising: designing an interventional control system on the basis of an original computer control system, wherein the interventional control system comprises an analog-to-digital conversion unit, a control processing unit, and a digital-to-analog conversion unit, and wherein the analog-to-digital conversion unit of the interventional control system receives a signal from a data acquisition module of the original computer control system and inputs the signal to the control processing unit of the interventional control system for processing according to a built-in interventional control processing program, then the digital-to-analog conversion unit of the interventional control system performs digital-to-analog conversion on the signal output by the control processing unit, and then outputs a signal obtained after the digital-to-analog conversion to an analog-to-digital conversion unit of the original computer control system, thereby, implementing a function upgrade of the original computer control system without changing the operating program of the original computer control system.

2. The interventional control method based on computer control system of claim 1, the control method characterized in, the interventional control system comprises a data acquisition module, and the analog-to-digital conversion unit of the interventional control system receives both signals output from the data acquisition module of the interventional control system and from the data acquisition module of the original computer control system, and the control processing unit processes the output signal and then outputs a control signal which is to be converted by the digital-to-analog conversion unit and then input to the analog-to-digital conversion unit of the original computer control system.

3. The interventional control method based on computer control system of claim 2, the control method characterized in, the interventional control system comprises an execution unit which performs a corresponding control instruction according to a control signal output from an operating processing program of the control processing unit of the interventional control system.

4. The interventional control method based on computer control system of claim 3, the method characterized in, a manual/automatic operation conversion unit is designed in cooperation with the interventional control system, wherein the manual/automatic operation conversion unit transmits a manual operation data signal to the analog-to-digital conversion unit of the interventional control system through a manual operation sensing module, and the control processing unit of the interventional control system analyzes and processes the obtained manual operation data signal and determines whether to copy or change the received manual operation data signal, and wherein the copied manual operation data signal is transmitted to the original computer control system by the digital-to-analog conversion unit of the interventional control system, and the changed manual operation data signal is transmitted to the original computer system by the digital-to-analog conversion unit of the interventional control system □ and wherein an original analog signal of the original computer control system is copied or changed by the interventional control system to implement the gapless access conversion control of manual/automatic operation of the original computer control system.

5. The interventional control method based on computer control system of claim 2, the method characterized in, a manual/automatic operation conversion unit is designed in cooperation with the interventional control system, wherein the manual/automatic operation conversion unit transmits a manual operation data signal to the analog-to-digital conversion unit of the interventional control system through a manual operation sensing module, and the control processing unit of the interventional control system analyzes and processes the obtained manual operation data signal and determines whether to copy or change the received manual operation data signal, and wherein the copied manual operation data signal is transmitted to the original computer control system by the digital-to-analog conversion unit of the interventional control system, and the changed manual operation data signal is transmitted to the original computer system by the digital-to-analog conversion unit of the interventional control system □ and wherein an original analog signal of the original computer control system is copied or changed by the interventional control system to implement the gapless access conversion control of manual/automatic operation of the original computer control system.

6. The interventional control method based on computer control system of claim 1, the control method characterized in, the interventional control system comprises an execution unit which performs a corresponding control instruction according to a control signal output from an operating processing program of the control processing unit of the interventional control system.

7. The interventional control method based on computer control system of claim 6, the method characterized in, a manual/automatic operation conversion unit is designed in cooperation with the interventional control system, wherein the manual/automatic operation conversion unit transmits a manual operation data signal to the analog-to-digital conversion unit of the interventional control system through a manual operation sensing module, and the control processing unit of the interventional control system analyzes and processes the obtained manual operation data signal and determines whether to copy or change the received manual operation data signal, and wherein the copied manual operation data signal is transmitted to the original computer control system by the digital-to-analog conversion unit of the interventional control system, and the changed manual operation data signal is transmitted to the original computer system by the digital-to-analog conversion unit of the interventional control system☐ and wherein an original analog signal of the original computer control system is copied or changed by the interventional control system to implement the gapless access conversion control of manual/automatic operation of the original computer control system.

8. The interventional control method based on computer control system of claim 1, the method characterized in, a manual/automatic operation conversion unit is designed in cooperation with the interventional control system, wherein the manual/automatic operation conversion unit transmits a manual operation data signal to the analog-to-digital conversion unit of the interventional control system through a manual operation sensing module, and the control processing unit of the interventional control system analyzes and processes the obtained manual operation data signal and determines whether to copy or change the received manual operation data signal, and wherein the copied manual operation data signal is transmitted to the original computer control system by the digital-to-analog conversion unit of the interventional control system, and the changed manual operation data signal is transmitted to the original computer system by the digital-to-analog conversion unit of the interventional control system, and wherein an original analog signal of the original computer control system is copied or changed by the interventional control system to implement the gapless access conversion control of manual/automatic operation of the original computer control system.

9. An interventional computer control system comprising: designing an interventional control system on the basis of an original computer control system, wherein the interventional control system comprises an analog-to-digital conversion unit, a control processing unit, and a digital-to-analog conversion unit, and wherein the analog-to-digital conversion unit of the interventional control system receives a signal output from a data acquisition module of the original computer control system and inputs the signal to the control processing unit of the interventional control system, and the digital-to-analog conversion unit of the interventional control system outputs a signal to the analog-to-digital conversion unit of the original computer control system.

10. The interventional computer control system of claim 9, characterized in, the interventional control system comprises a data acquisition module which comprises one, two or more sensors, and the sensors output a signal to the analog-to-digital conversion unit of the interventional control system.

11. The interventional computer control system of claim 10, characterized in, the interventional control system comprises an execution unit, and the control processing unit of the interventional control system has an output connected to the execution unit.

12. The interventional computer control system of claim 11, characterized in, a manual/automatic operation conversion unit is designed in cooperation with the interventional control system, wherein the manual/automatic operation conversion unit includes a manual operation sensing module which outputs a signal to the analog-to-digital conversion unit of the interventional control system.

13. The interventional computer control system of claim 11, characterized in, a manual/automatic operation conversion unit is designed in cooperation with the interventional control system, wherein the manual/automatic operation conversion unit includes a manual operation sensing module which outputs a signal to the analog-to-digital conversion unit of the interventional control system.

14. The interventional computer control system of claim 10, characterized in, a manual/automatic operation conversion unit is designed in cooperation with the interventional control system, wherein the manual/automatic operation conversion unit includes a manual operation sensing module which outputs a signal to the analog-to-digital conversion unit of the interventional control system.

15. The interventional computer control system of claim 9, characterized in, the interventional control system comprises an execution unit, and the control processing unit of the interventional control system has an output connected to the execution unit.

16. The interventional computer control system of claim 15, characterized in, a manual/automatic operation conversion unit is designed in cooperation with the interventional control system, wherein the manual/automatic operation conversion unit includes a manual operation sensing module which outputs a signal to the analog-to-digital conversion unit of the interventional control system.

* * * * *